(12) United States Patent
Greenhill et al.

(10) Patent No.: US 7,532,003 B1
(45) Date of Patent: May 12, 2009

(54) METHOD AND APPARATUS FOR SETTING VDD ON A PER CHIP BASIS

(75) Inventors: David J. Greenhill, Portola Valley, CA (US); Curtis R. McAllister, Los Altos, CA (US); Thomas R. Caron, Wakefield, MA (US); Shanker Bhagvat, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 359 days.

(21) Appl. No.: 11/451,254

(22) Filed: Jun. 12, 2006

(51) Int. Cl.
*G01R 31/26* (2006.01)
(52) U.S. Cl. .................... 324/158.1; 324/765
(58) Field of Classification Search .............. None
See application file for complete search history.

(56) References Cited

U.S. PATENT DOCUMENTS 5,787,014 A * 7/1998 Hall et al. ............... 323/312
5,939,868 A * 8/1999 Hall et al. ............... 323/281
6,795,927 B1 9/2004 Altmejd et al.
6,819,538 B2 * 11/2004 Blaauw et al. ............ 361/90
6,823,465 B2 11/2004 Zhang
6,845,456 B1 1/2005 Menezes et al.

* cited by examiner

*Primary Examiner*—Paresh Patel
(74) *Attorney, Agent, or Firm*—Meyertons Hood Kivlin Kowert & Goetzel, P.C.; Rory D. Rankin

(57) ABSTRACT

An integrated circuit test system. The test system includes a controller and an integrated circuit coupled to a voltage source and a current monitor. The controller causes the voltage source to supply a voltage to the integrated circuit, receives a signal from the current monitor indicating a power dissipation of the integrated circuit, and causes the voltage source to reduce the voltage until the signal from the current monitor indicates the power dissipation of the integrated circuit is less than a predetermined threshold. The controller stores in the integrated circuit in a non-volatile storage register that is accessible via a subset of access pins, a value corresponding to the voltage supplied to the integrated circuit when the power dissipation of the integrated circuit is less than the predetermined threshold. The subset of access pins provides at least one function in addition to accessing the non-volatile storage register.

20 Claims, 7 Drawing Sheets

US 7,532,003 B1

METHOD AND APPARATUS FOR SETTING VDD ON A PER CHIP BASIS

BACKGROUND OF THE INVENTION

1. Field of the Invention

This invention relates to integrated circuit chips and, more particularly, to techniques for setting the operating voltage of integrated circuit chips to improve speed and power performance.

2. Description of the Related Art

There is growing demand to operate integrated circuit chips at higher and higher speeds. However, higher speed operation generally increases the chip's power dissipation. Both power dissipation and maximum operating speed are related to the operating voltage supplied to the chip. Increasing the supply voltage enables a chip to operate at a higher speed, but also causes higher power dissipation. Conversely, decreasing the supply voltage decreases the maximum operating speed, but also reduces the power dissipation.

Typically, integrated circuits may be sorted during testing according to broad categories of maximum operating speed at a nominal operating voltage. For example, processor chips may be sorted into bins of 1.2 GHz, 1.0 GHz and 0.8 GHz at a nominal 1.3 volts. During testing a processor may be operated at 1.3 volts while maximum operating speed is determined, dependent on the measured power dissipation. The processor is then placed in a bin according to the highest speed at which the processor operates with power dissipation below a predetermined threshold value.

Generally speaking, demand is highest for the highest maximum operating speed integrated circuits. Furthermore, there are only a few values of maximum operating speed for a given integrated circuit since each additional speed value adds to the expense and complexity of designing, manufacturing, testing, marketing, and maintaining a parts inventory for equipment that uses the integrated circuit. Circuit applications also place constraints on the acceptable power dissipation. Consequently, a single power dissipation threshold is generally used during integrated circuit testing.

In addition to the above considerations, decreasing operating voltage may cause power dissipation to decrease faster than the rate at which maximum operating speed decreases. Consequently, for some number of integrated circuits that operate at an acceptable speed but at a power level that is slightly above the power threshold, it may be possible to choose a lower operating voltage at which the power dissipation drops below the power threshold while an acceptable maximum speed is maintained. Unfortunately, even though test equipment may be capable of determining an optimum supply voltage for each integrated circuit, changing the supply voltage on a part-by-part basis is problematic. For instance, using a different voltage in each circuit application adds cost and complexity to the hardware. Variable voltage supplies are more costly and complicated than fixed supplies. For a circuit application to deliver the desired voltage to a particular integrated circuit using a variable supply, some method of identifying the desired operating voltage for that particular integrated circuit would be needed. It would be desirable to set the operating voltage on a per-chip basis without increasing the complexity of the application circuitry. It would also be desirable to set the operating voltage on a per-chip basis without increasing the size and/or number of pins of the integrated circuit itself. In addition, it would be desirable to be able to use integrated circuits that operate at a voltage other than the nominal voltage in existing hardware designs.

SUMMARY OF THE INVENTION

Various embodiments of an apparatus, systems, and methods are disclosed. In one embodiment, a test system comprises a controller and an integrated circuit coupled to a voltage source and a current monitor. The controller is configured to cause the voltage source to supply a voltage to the integrated circuit, receive a signal from the current monitor indicating a power dissipation of the integrated circuit, cause the voltage source to reduce the voltage until the signal from the current monitor indicates the power dissipation of the integrated circuit is less than a predetermined threshold, and store in the integrated circuit a value corresponding to the voltage supplied to the integrated circuit when the power dissipation of the integrated circuit is less than the predetermined threshold.

In a further embodiment, the integrated circuit comprises a plurality of access pins and a non-volatile storage register. The value is stored in at least a portion of the non-volatile storage register and the non-volatile storage register is accessible via a subset of the access pins. The subset of the access pins provides at least one function in addition to accessing the non-volatile storage register.

In another embodiment, the controller is further configured to cause a clock source to deliver a clock to the integrated circuit at a first clock speed and test the operation of the integrated circuit at the first clock speed. If the integrated circuit passes an operating test at the first clock speed and if the power dissipation of the integrated circuit is greater than the predetermined threshold when the voltage is reduced to below a predetermined threshold voltage, the controller is further configured to cause the clock source to deliver a clock to the integrated circuit at a second clock speed, lower than the first clock speed, and test the operation of the integrated circuit at the second clock speed.

In a still further embodiment, an apparatus comprises an integrated circuit coupled to a voltage source and a controller. The controller is configured to cause the voltage source to supply a voltage to the integrated circuit, retrieve a value from the integrated circuit, and cause the voltage source to change the voltage dependent on the value.

Figure 1:
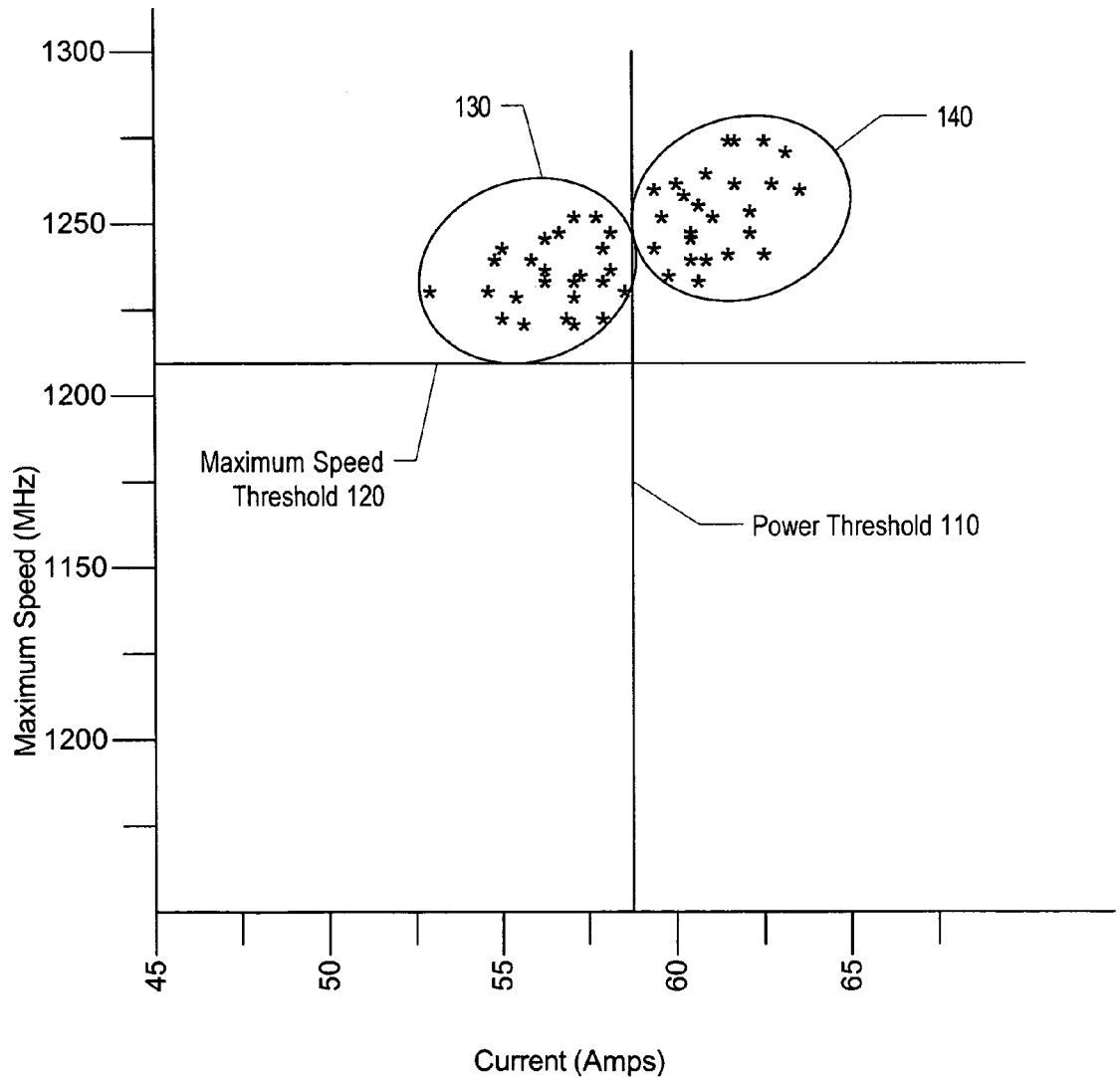
FIG. 1 is a scatter plot of maximum speed vs. current for a representative sample of integrated circuit chips.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 is a scatter plot of maximum speed vs. current for a representative sample of integrated circuit chips. Each star (*) in the figure represents the values of current and maximum speed measured during testing of a given chip operated at a fixed supply voltage, such as, for example, a nominal 1.300 volts. Since the voltage is fixed and power is equal to the product of voltage and current, the measured current is representative of the power dissipation at a given maximum speed.

In the illustration, a power threshold 110 is represented by a vertical line at approximately 58 amps. A maximum speed threshold 120 is represented by a horizontal line at approximately 1,210 MHz. For a chip to meet qualification requirements at a particular speed, for example 1,200 MHz, the measured power must be to the left of power threshold 110 and the measured maximum speed must be above the maximum speed threshold 120. The maximum speed threshold 120 may be set at a small margin (in this case, 10 MHz) above the chip's rated maximum speed. Chips for which the measured power is to the right of power threshold 110, even though the measured maximum speed is above the maximum speed threshold 120, may be expected to overheat in operation. Consequently, unless these chips can be operated at a voltage lower than the nominal voltage, they may be downgraded in speed or discarded. Apparatus and methods for operating at least some of these chips at a lower voltage without the need for significant changes to existing application circuitry are described below.

Figure 2:
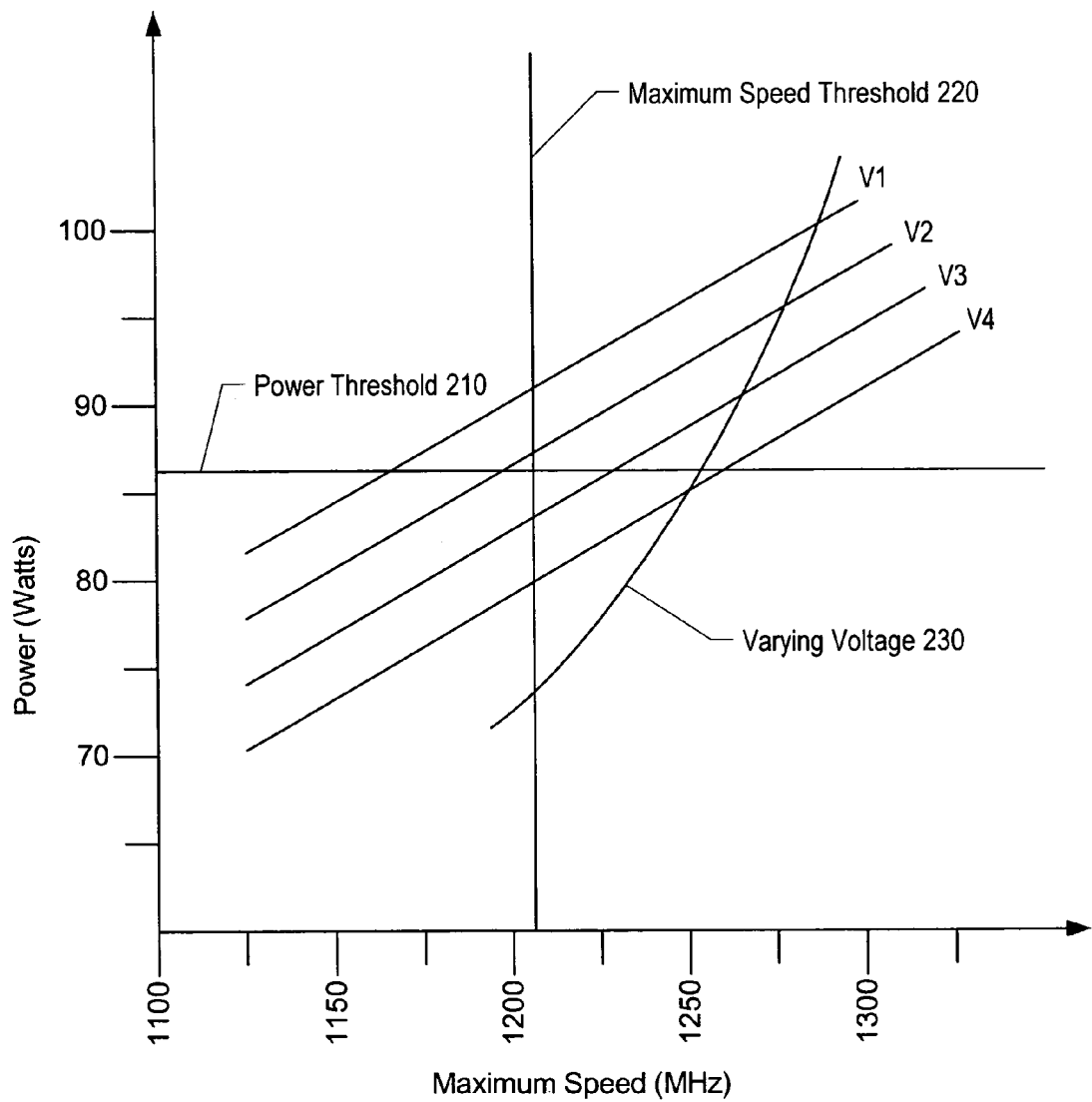
FIG. 2 illustrates the relationship between power and maximum speed for a variety of operating voltages.

FIG. 2 illustrates the relationship between power and maximum speed for a variety of operating voltages. Four example voltage curves, V1-V4, are shown representing power versus maximum speed for a set of fixed voltages. Also shown is a varying voltage curve 230. Voltage curve V1 may indicate the relationship between power and maximum speed at nominal chip voltage of 1.3 volts. Voltage curve V2 may indicate the relationship between power and maximum speed at a chip voltage of 1.275 volts. Voltage curve V3 may indicate the relationship between power and maximum speed at a chip voltage of 1.25 volts. Voltage curve V4 may indicate the relationship between power and maximum speed at a chip voltage of 1.225 volts. In the illustration, a power threshold 210 is represented by a horizontal line at approximately 86 Watts. A maximum speed threshold 220 is represented by a vertical line at approximately 1,210 MHz.

During testing, it is desirable to find as many chips as possible that operate with a power dissipation less than power threshold 210 and a maximum speed greater than maximum speed threshold 220, i.e. chips that operate in the lower right quadrant of FIG. 2. Each voltage curve V1-V4 represents a distribution of a number of individually tested chips. Lowering the supply voltage (e.g., changing from voltage curve V3 to voltage curve V4) may increase the number of chips whose test results fall into the lower right quadrant. So too, for a given chip, lowering the supply voltage may reduce the power dissipated at a given maximum speed. This effect is illustrated by varying voltage curve 230. As shown, a chip operating at a supply voltage corresponding to voltage curve V1 (i.e., at the intersection of curves V1 and 230) may exceed maximum speed threshold 220, but also exceed power threshold 210, and thus be subject to rejection or down-grading. However, if the same chip is operated at a supply voltage corresponding to voltage curve V3 (i.e., at the intersection of curves V3 and 230), the chip may still exceed the maximum speed threshold 220, but operate below power threshold 210. Thus, at the lower supply voltage, the chip may qualify for a maximum speed rating corresponding to maximum speed threshold 220. As used herein, "less than" a particular threshold may include being equal to the threshold. Similarly, "greater than" a particular threshold may include being equal to the threshold. Those skilled in the art will appreciate the various methods and mechanisms described herein may be configured to operate in a variety of such alternative ways. All such alternatives are contemplated.

Figure 3:
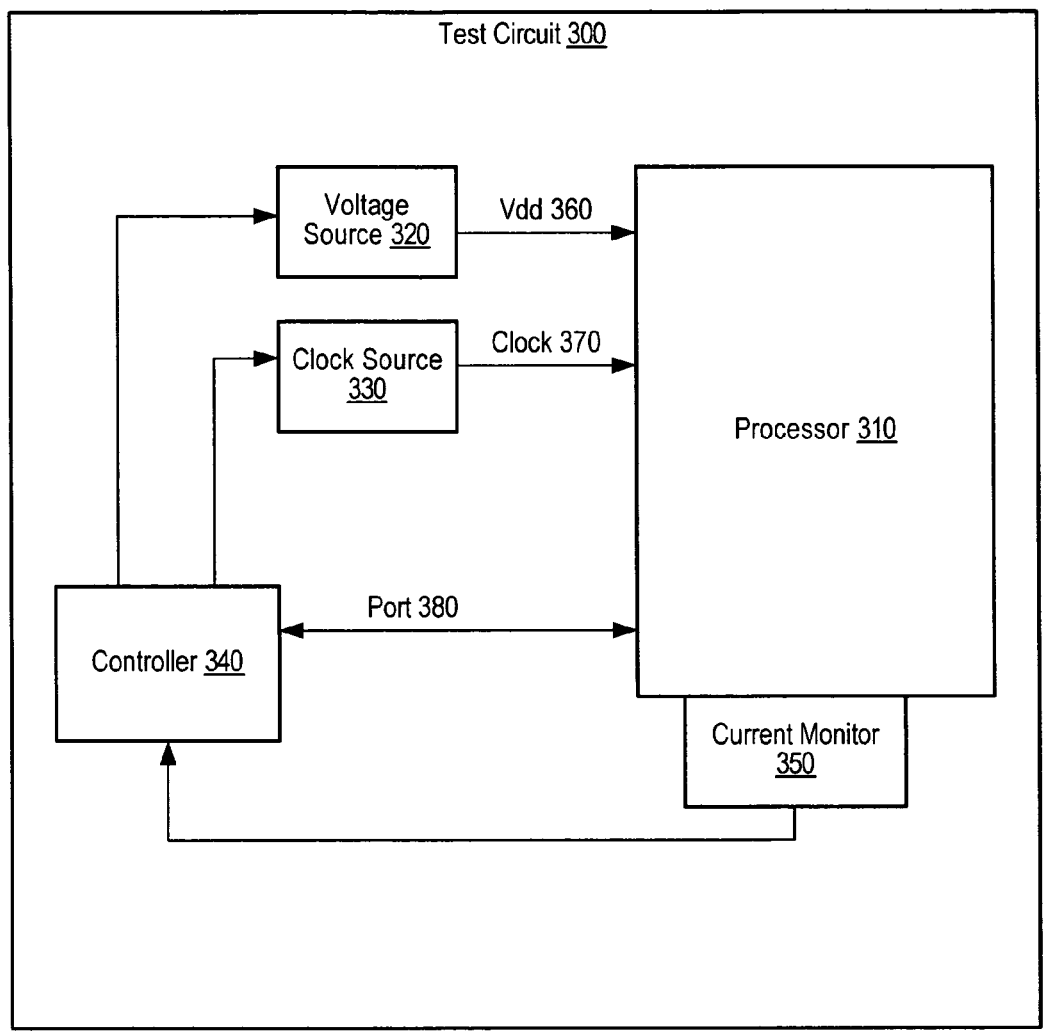
FIG. 3 is a generalized block diagram of one embodiment of a test circuit that may be used to determine a suitable supply voltage (Vdd) for an integrated circuit chip.

FIG. 3 is a generalized block diagram of one embodiment of a test circuit 300 that may be used to determine a suitable supply voltage (Vdd) for an integrated circuit chip. As shown, test circuit 300 includes a processor 310 coupled to a voltage source 320, a clock source 330, a controller 340, and a current monitor 350. Processor 310 is but one example of a variety of integrated circuit chips that may be tested by test circuit 300. In alternative embodiments, test circuit 300 may be used to test digital signal processors, gate arrays, memory devices, or any other clocked integrated circuit instead of processor 310.

In operation, voltage source 320 may supply a voltage, commonly referred to as Vdd, 360 to processor 310. In one embodiment, the value of Vdd 360 may be adjustable. For example, in one embodiment, voltage source 320 may be a variable supply such as a DC-to-DC converter. Voltage source 320 may be configured to receive commands from controller 340 indicating a desired value of Vdd 360. Controller 340 may be configured to execute a set of test instructions that generate commands to adjust the value of Vdd 360.

In addition, clock source 330 may supply a clock 370 signal to processor 310.

In one embodiment, the speed of clock 370 may be adjustable. For example, clock source 330 may be configured to receive commands from controller 340 indicating a desired value of the clock speed. Controller 340 may be configured to execute a set of test instructions that generate commands to adjust the speed of clock 370.

Current monitor 350 may be coupled to processor 310 so as to measure its current consumption levels. The measured current may then be used to estimate a power dissipation of the processor 310, such as by multiplying the measured current by a current voltage level (e.g., Vdd). Controller 340 may use the measured power dissipation of processor 310 to determine whether or not to adjust the value of Vdd. In an alternative embodiment, power dissipation may be measured through the placement of a thermal sensor close to or in thermal contact with processor 310, instead of the use of current monitor 350. A detailed description of the process by which a desired value of Vdd may be determined is given below.

In one embodiment, controller 340 is coupled to processor 310 via a port 380. Port 380 may provide a path for data to be read from and written to a variety of locations within processor 310. For example, port 380 may be a standard test interface such as a Joint Test Access Group (JTAG) interface. Once controller 340 has determined a desired value of Vdd, a corresponding code may be stored in processor 310 via port 380. For example, processor 310 may include a register of electrically blown fuses. Each bit of the register may be written once (i.e., asserted by blowing a fuse or de-asserted by not blowing the fuse). The values of one or more bits stored in the register may encode the desired value of Vdd. For instance, in one embodiment, the value encoded in the register may be a signed number representing the difference between the desired value of Vdd and the nominal value of Vdd. A variety of alternative encodings for representing the desired value of Vdd will be apparent to those skilled in the art. Subsequently, such as during startup, the contents of the register may be read and used to set the operating value of Vdd.

Figure 4:
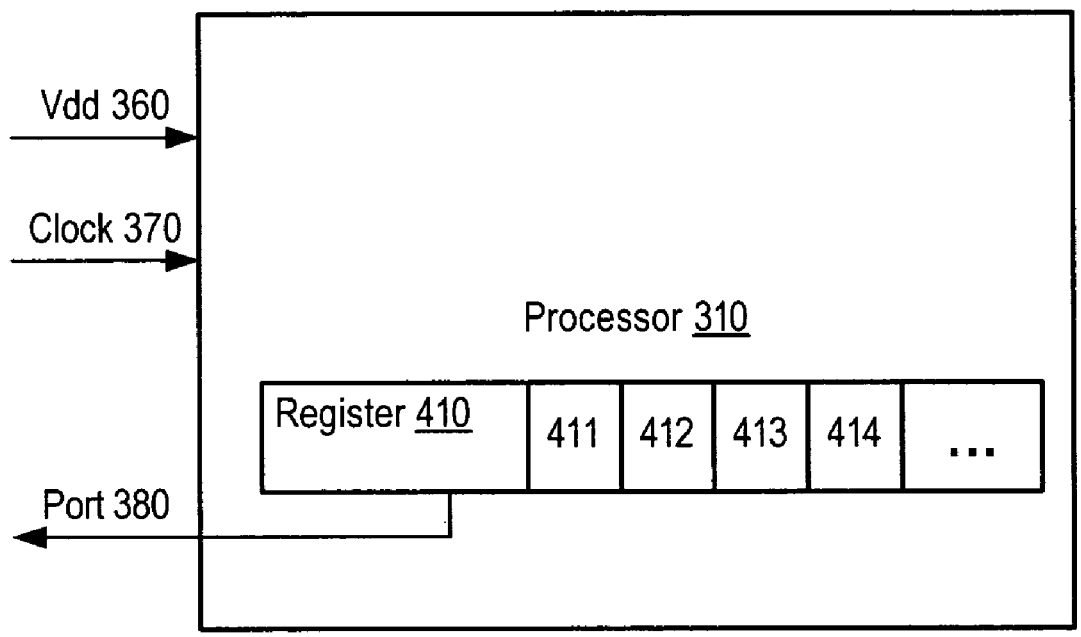
FIG. 4 illustrates one embodiment of a processor including a register for encoding the processor's desired operating supply voltage (Vdd).

FIG. 4 illustrates one embodiment of a processor 310 including a register 410 for encoding the processor's desired operating supply voltage (Vdd). Register 410 includes bit positions 411-414. Each of bit positions 411-414 may be an electrically blown fuse. In one embodiment, once a fuse is blown, its value may not be changed. Subsequently, reading a bit position in which the fuse has been blown may result in a logic "1" and reading a bit position in which the fuse has not been blown may result in a logic "0". In other embodiments, the polarity may be reversed. In further alternative embodiments, any type of non-volatile memory may be used to store a value corresponding to the desired value of Vdd.

In one embodiment, values stored in register 410 may be accessed via a port 380 that may be provided in conventional processors for general testing purposes. Using an existing port avoids the addition of special supply voltage readout pins to processor 310. Furthermore, the use of a pre-existing port that is generally provided on a variety of processors for other purposes may allow processor 310 to be used in existing circuitry without modifying the pin layout.

Figure 5:
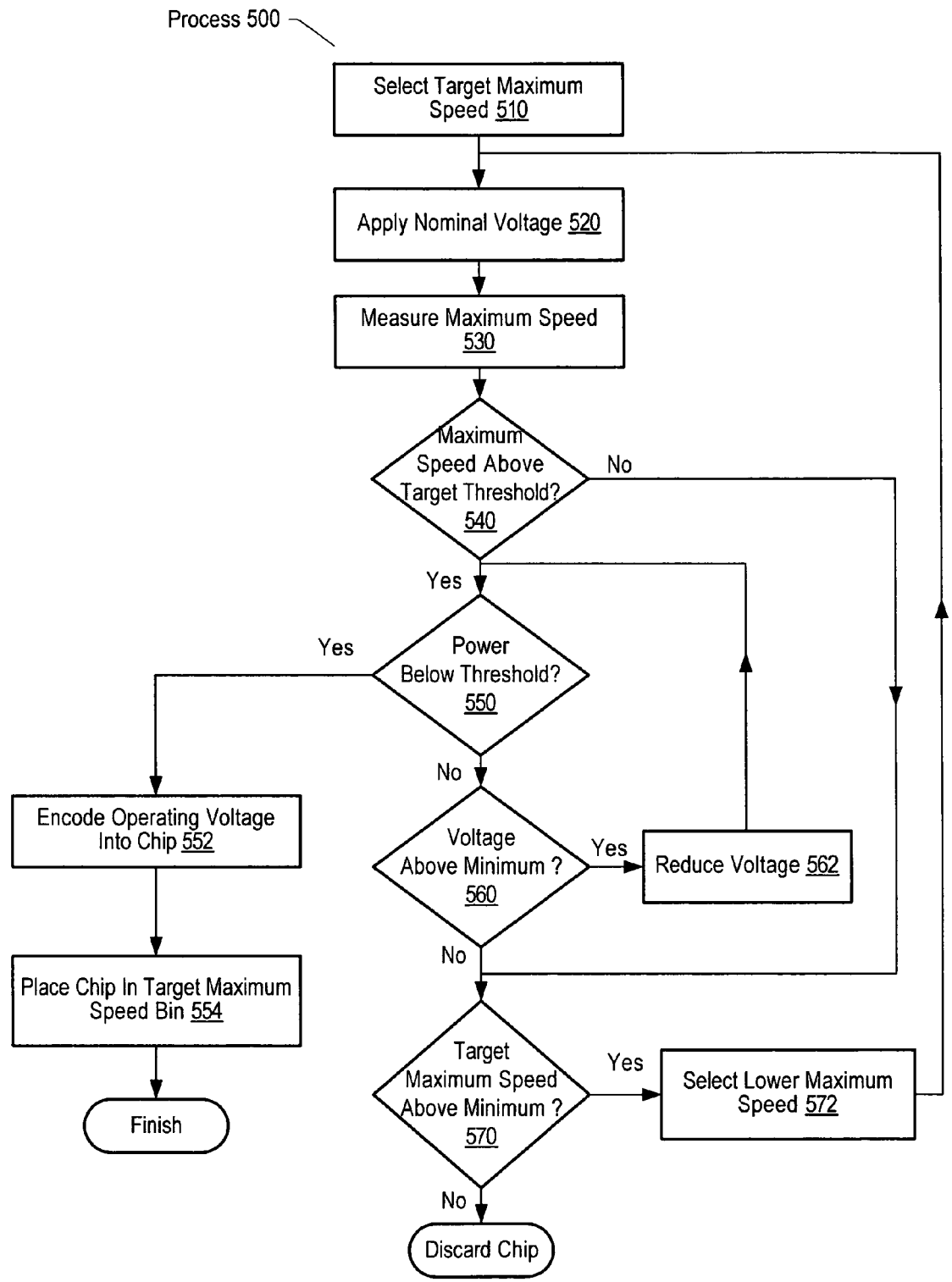
FIG. 5 illustrates one embodiment of a process that may be used to sort integrated circuit chips by maximum speed using individually adjusted values of Vdd for each chip.

FIG. 5 illustrates one embodiment of a process 500 that may be used to sort integrated circuit chips by maximum speed using individually adjusted values of Vdd for each chip. Beginning at block 510, a target maximum speed for the chip under test may be selected. Proceeding to block 520, a nominal value of supply voltage (Vdd) may be applied to the chip under test. Once the chip is operating at the nominal voltage, the maximum speed may be measured by conventional methods (block 530). If the maximum speed is above a threshold corresponding to the target maximum speed (decision block 540) and the power dissipation is below a target threshold (block 550), then the chip may be suitable for operation at the target maximum speed. If so, then a value corresponding to the value of Vdd at which the chip was tested may be stored within the chip (block 552). Once the Vdd value is stored, the chip may be placed in a bin corresponding to the target maximum speed (block 554).

If the maximum speed is not above a threshold corresponding to the target maximum speed (decision block 540) and the target maximum speed is above a minimum target value (decision block 570), then a lower target maximum speed may be selected (block 572) and the chip retested (block 510). If the maximum speed is not above a threshold corresponding to the target maximum speed (decision block 540) and the target maximum speed is not above a minimum target value (decision block 570), then the chip may be discarded.

If the maximum speed is above a threshold corresponding to the target maximum speed (decision block 540) and the power dissipation is not below a target threshold (block 550), then the chip may only be suitable for operation at the target maximum speed if the value of Vdd is reduced. In this case, if the value of Vdd is not above a minimum acceptable operating voltage (decision block 560), then the chip may only be suitable for operation at a lower maximum speed. If the target maximum speed is above a minimum target value (decision block 570), then a lower target maximum speed may be selected (block 572) and the chip retested. Returning to decision block 560, if the value of Vdd is above a minimum acceptable operating voltage, then the operating voltage may be reduced (block 562) and the chip retested at the same maximum speed. Process 500 may then continue with a check of the power dissipation at the lower value of Vdd (decision block 550), looping until either a value of Vdd is found at which the chip will operate with acceptable maximum speed and power dissipation or it is found that the chip doesn't operate at an acceptable combination of speed and power and the chip is discarded. In this manner, the voltage may be "progressively" reduced until the desired operating parameters are determined. It is to be understood that in various embodiments, progressively changing the voltage may include both voltage increases and decreases. Thus, while a series of voltage levels may be observed to decrease over a particular period of time (e.g., a first voltage level is higher than a last voltage level of the time period), the particular period of time may include some voltage increases as well. All such alternative embodiments are contemplated.

Figure 6:
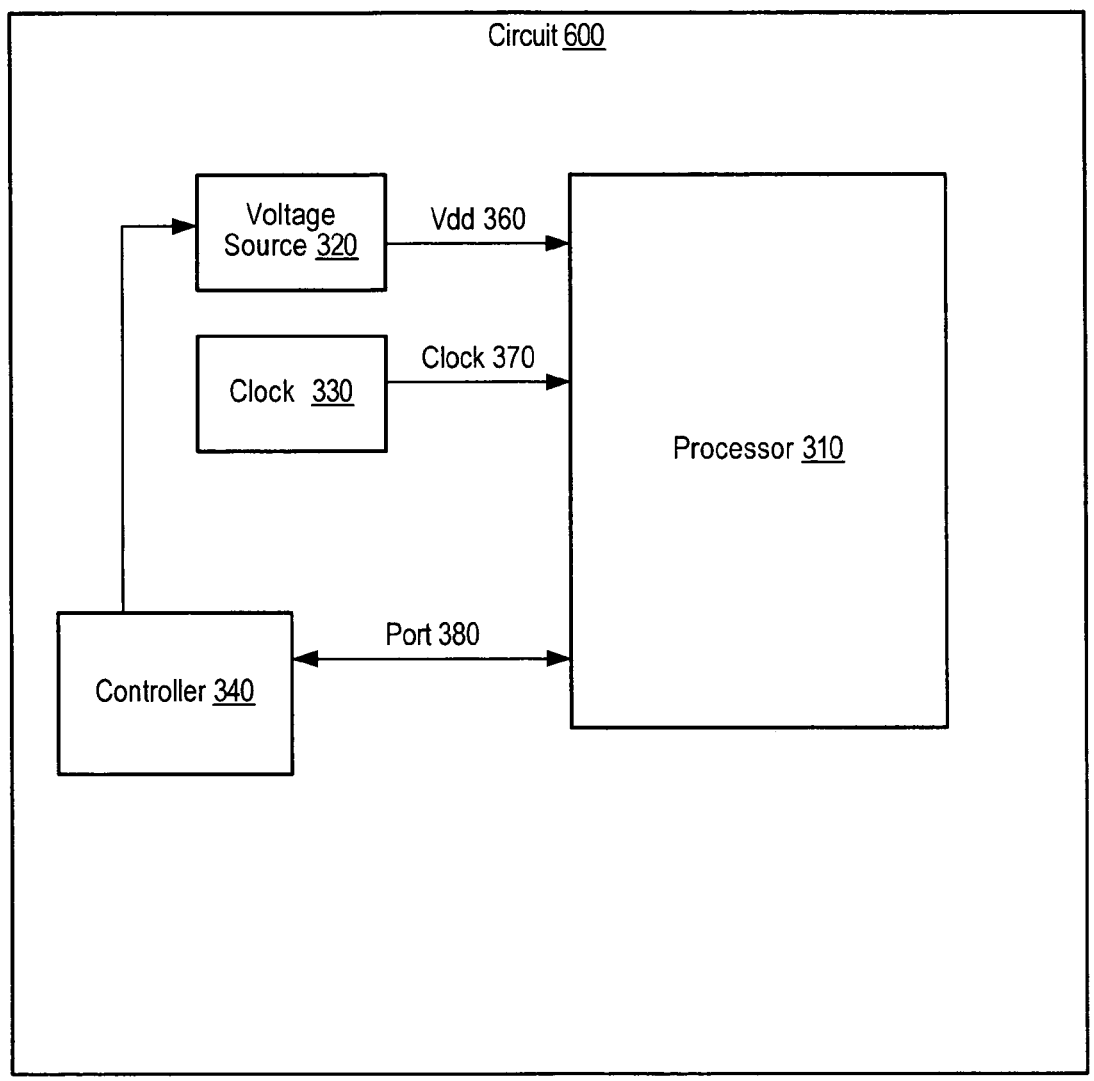
FIG. 6 is a generalized block diagram of one embodiment of an application circuit for an integrated circuit chip with an adjustable operating supply voltage (Vdd).

FIG. 6 is a generalized block diagram of one embodiment of an application circuit 600 for an integrated circuit chip with an adjustable operating supply voltage (Vdd). As shown, circuit 600 includes a processor 310, a voltage source 320, a clock source 330, and a controller 340. Processor 310 may be coupled to controller 340 via a port 380. Processor 310 is but one example of a variety of integrated circuit chips that may be used in circuit 600: In alternative embodiments, circuit 600 may include a digital signal processor, a gate array, a memory device, or any other clocked integrated circuit instead of processor 310.

In operation, clock source 330 may supply a clock 370 signal to processor 310. Voltage source 320 may supply a voltage, Vdd 360, to processor 310. In one embodiment, the value of Vdd 360 may be adjustable. For example, voltage source 320 may receive commands from controller 340 indicating a desired value of Vdd 360. Controller 340 may read a value from a register within processor 310 via a port 380. The register value may correspond to a desired Vdd value. Controller 340 may convert the read value into a command indicating the desired value of Vdd and convey the command to voltage source 320.

In one embodiment, the circuit layout of circuit 600 may be that of a conventional circuit design in which a fixed value of Vdd is supplied to an integrated circuit chip during operation. During testing, using the same circuit layout, controller 340 and voltage source 320 may often be configured to vary the value of Vdd supplied to a processor or other integrated circuit chip. However, the conventional circuit design alone is not sufficient to provide the desired value of Vdd to any one of a selection of chips, each of which may require a different value of Vdd. By adding the storage of a value corresponding to a predetermined target value of Vdd in a register within processor 310 that is accessible via an existing port 380 and software only changes to controller 340, circuit 600 may be used to supply a predetermined target value of Vdd to a processor or other integrated circuit chip during operation without any changes to the circuit layout.

Figure 7:
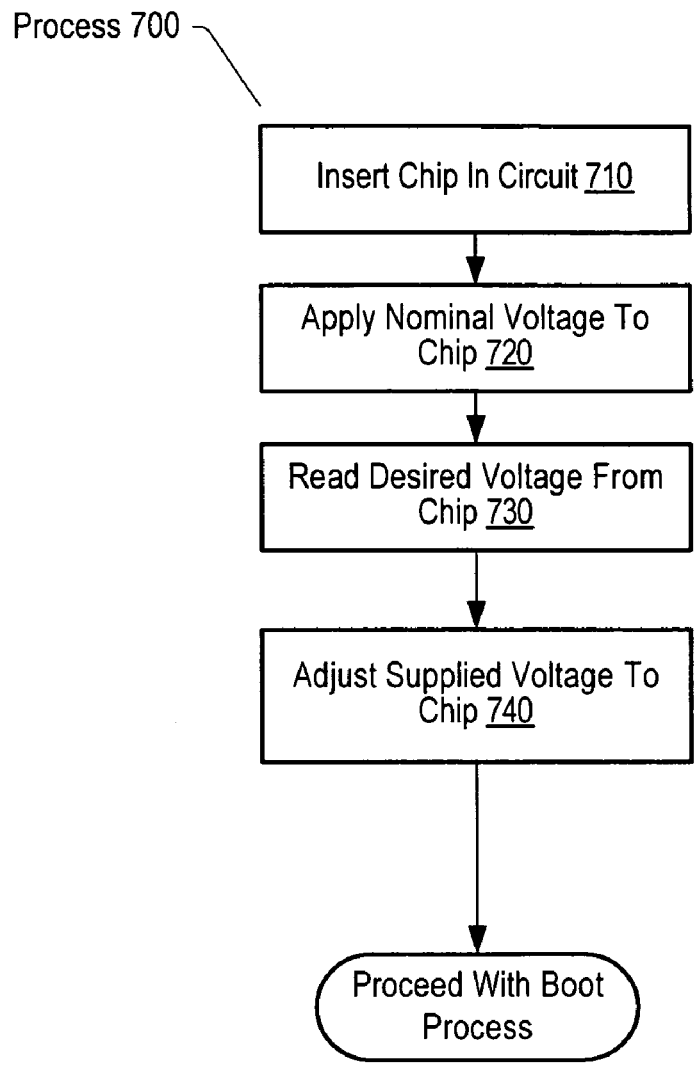
FIG. 7 illustrates one embodiment of a process that may be used to supply a desired operating voltage for an integrated circuit chip.

FIG. 7 illustrates one embodiment of a process 700 that may be used to supply a desired operating voltage for an integrated circuit chip. Initially, a chip is inserted into a circuit (block 710) that applies a nominal value of Vdd to the chip (block 720). Once the chip is operational, but before the power dissipation of the chip rises to an undesirable level, the desired value of Vdd may be determined by reading a value from a register within the chip (block 730) that corresponds to the desired value of Vdd. Next, the value of Vdd may be adjusted to match the desired value (block 740). Once the desired value of Vdd has been applied, conventional boot processes may proceed.

It is noted that the above described embodiments may comprise software. For example, the functionality of controller 340 and processor 310 may be implemented in hardware, software, firmware, or some combination of the above. In such embodiments, the program instructions which implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Further, while the above generally describes testing a processor, the methods and mechanisms described may be applied to a wide variety of devices, such as a memory device, a programmable logic device, an application specific integrated circuit, a digital signal processor, and so on.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A test system comprising:
   an integrated circuit coupled to a voltage source and a current monitor; and
   a controller configured to:
   cause the voltage source to supply a voltage to the integrated circuit;
   receive an indication from the current monitor indicative of a power dissipation of the integrated circuit;
   cause the voltage source to progressively reduce a voltage supplied to the integrated circuit;
   identify a particular voltage which corresponds to an indication that a power dissipation of the integrated circuit is less than a predetermined threshold; and
   store in the integrated circuit a value corresponding to a voltage supplied to the integrated circuit when the power dissipation of the integrated circuit is less than the predetermined threshold.

2. The system of claim 1, wherein the integrated circuit comprises:
   a plurality of access pins; and
   a non-volatile storage register;
   wherein the value is stored in at least a portion of the non-volatile storage register; and
   wherein the non-volatile storage register is accessible via a subset of the access pins; and
   wherein the subset of the access pins provides at least one function in addition to accessing the non-volatile storage register.

3. The system of claim 2, wherein the plurality of access pins comprise a JTAG interface.

4. The system of claim 2, wherein the at least a portion of the non-volatile storage register comprises one or more electrical fuses.

5. The system of claim 1, wherein the controller is further configured to:
   cause the integrated circuit to operate at a first clock speed;
   test operation of the integrated circuit at the first clock speed; and
   test operation of the integrated circuit at a second clock speed lower than the first clock speed, if the integrated circuit passes the operating test at the first clock speed and a power dissipation of the integrated circuit is greater than the predetermined threshold.

6. The system of claim 1, wherein the controller is further configured to:
   cause the integrated circuit to operate at a first clock speed;
   test operation of the integrated circuit at the first clock speed; and
   if the integrated circuit passes the operating test at the first clock speed and the power dissipation of the integrated circuit is less than the predetermined threshold:
   cause the voltage source to increase the voltage;
   cause the integrated circuit to operate at a second clock speed which is higher than the first clock speed; and
   test operation of the integrated circuit at the second clock speed.

7. The system of claim 1, wherein the value which is stored in the integrated circuit corresponds to the particular voltage.

8. The system of claim 1, wherein the integrated circuit is marked with a nominal operating voltage and a value which indicates a difference between the nominal operating voltage and a voltage supplied to the integrated circuit when a power dissipation of the integrated circuit is less than the predetermined threshold.

9. An apparatus comprising:
   an integrated circuit including:
   a non-volatile storage register; and
   a plurality of access pins, wherein at least a subset of the access pins provides at least one function in addition to providing access to the non-volatile storage register;
   wherein the integrated circuit is:
   operable at a level of power dissipation above a predetermined threshold, responsive to a first voltage; and
   operable at a level of power dissipation below a predetermined threshold voltage, responsive to a second voltage;
   wherein the non-volatile storage register is:
   configured to store a value corresponding to the second voltage; and
   accessible via a subset of the access pins while the integrated circuit is operating at the first voltage.

10. The apparatus of claim 9, wherein the integrated circuit is one of a processor, a memory, a programmable logic device, an application specific integrated circuit, and a digital signal processor.

11. The apparatus of claim 9, wherein the integrated circuit is marked with a nominal operating voltage and a value which indicates a difference between the nominal operating voltage and the second voltage.

12. The apparatus of claim 9, wherein the integrated circuit is coupled to a voltage source and a controller,
   wherein the controller is configured to:
   cause the voltage source to supply a voltage to the integrated circuit;
   retrieve a value from the integrated circuit; and
   cause the voltage source to change the voltage responsive to the value retrieved from the integrated circuit.

13. The apparatus of claim 9, wherein the plurality of access pins comprises a JTAG interface.

14. The apparatus of claim 9, wherein the at least a portion of the non-volatile storage register comprises one or more electrical fuses.

15. A method of testing comprising:
   supplying a first voltage to an integrated circuit;
   supplying a clock to the integrated circuit at a first clock speed; and
   if the integrated circuit fails an operating test at the first clock speed and the power dissipation of the integrated circuit is less than a predetermined threshold:

increasing the voltage supplied to the integrated circuit to a second voltage; and storing in the integrated circuit a value corresponding to the second voltage if the integrated circuit passes an operating test at the second voltage and the power dissipated by the integrated circuit is less than the predetermined threshold.

16. The method of claim 15, wherein if the integrated circuit passes an operating test at the first clock speed and a power dissipation of the integrated circuit is greater than the predetermined threshold, the method further comprises:

reducing the first voltage until a power dissipated by the integrated circuit is less than the predetermined threshold; and storing in the integrated circuit a value corresponding to a voltage supplied to the integrated circuit when the power dissipated by the integrated circuit is less than the predetermined threshold.

17. The method of claim 16, wherein the integrated circuit comprises a plurality of access pins and a non-volatile storage register, and wherein the method further comprises accessing the non-volatile storage register via a subset of the access pins, wherein the subset of the access pins provides at least one function in addition to providing access to the non-volatile storage register.

18. The method of claim 17, wherein the plurality of access pins comprises a JTAG interface.

19. The method of claim 17, wherein the at least a portion of the non-volatile storage register comprises one or more electrical fuses.

20. The method of claim 16, wherein if the integrated circuit passes an operating test at the first clock speed and a power dissipation of the integrated circuit is greater than the predetermined threshold, the method further comprises:

supplying a clock to the integrated circuit at a second clock speed which is lower than the first clock speed; and testing operation of the integrated circuit at the second clock speed.

* * * * *